(12) United States Patent
Li et al.

(10) Patent No.: US 10,358,081 B2
(45) Date of Patent: Jul. 23, 2019

(54) WHEELED VEHICLE AND WHEEL OF THE SAME

(71) Applicant: E-LINK TECHNOLOGY CO., LTD., Shenzhen (CN)

(72) Inventors: Pingzhi Li, Shenzhen (CN); Minyi Chen, Shenzhen (CN); Xihui Jiang, Shenzhen (CN)

(*) Notice: Subject to any disclaimer, the term of this patent is extended or adjusted under 35 U.S.C. 154(b) by 0 days.

(21) Appl. No.: 16/016,333

(22) Filed: Jun. 22, 2018

(65) Prior Publication Data
US 2019/0193627 A1 Jun. 27, 2019

(30) Foreign Application Priority Data
Dec. 22, 2017 (CN) ............. 2017 2 1814924 U

(51) Int. Cl.
*B60Q 1/00* (2006.01)
*B60Q 1/32* (2006.01)

(52) U.S. Cl.
CPC .......... *B60Q 1/326* (2013.01); *B60Q 1/0041* (2013.01); *B60B 2900/571* (2013.01); *B60B 2900/572* (2013.01)

(58) Field of Classification Search
CPC ........ B60B 2900/571; B60B 2900/572; B60Q 1/326
USPC ........................................................ 362/500
See application file for complete search history.

(56) References Cited

U.S. PATENT DOCUMENTS

| | | | | |
|---|---|---|---|---|
| 6,322,237 B1* | 11/2001 | Lee | ............ | B60Q 1/326 362/234 |
| 6,612,726 B1* | 9/2003 | Gloodt | ............ | B60Q 1/326 362/183 |
| 2004/0125612 A1* | 7/2004 | Jackson | ............ | B60Q 1/326 362/500 |
| 2005/0134475 A1* | 6/2005 | Reim | ............ | B60C 13/001 340/815.45 |
| 2018/0176460 A1* | 6/2018 | Telem | ............ | G03B 15/00 |
| 2018/0268747 A1* | 9/2018 | Braun | ............ | G09F 13/12 |

* cited by examiner

*Primary Examiner* — Gerald J Sufleta, II
(74) *Attorney, Agent, or Firm* — The Law Office of Austin Bonderer, PC; Austin Bonderer

(57) ABSTRACT

A wheeled vehicle and a wheel of the wheeled vehicle are provided. The wheel includes a wheel body with a light-emitting module. The light-emitting module includes an LED light bar, a flat mirror, and a two-way mirror. Both a mirror surface of the flat mirror and a reflective surface of the two-way mirror face the LED light bar. A transparent surface of the two-way mirror faces an outer side of the wheel. Looking through the transparent surface, one can see a black hole illusion that the LED lights extend indefinitely into the interior of the wheel, which makes the interior of the wheel appear a hollow visual effect to attract people's attention, thereby increasing the attractiveness of the product for consumers and enhancing the market competitiveness of the products.

20 Claims, 4 Drawing Sheets

WHEELED VEHICLE AND WHEEL OF THE SAME

CROSS-REFERENCE TO RELATED APPLICATIONS

The present application claims the benefit of Chinese Patent Application No. 201721814924.0 filed on Dec. 22, 2017. The above is hereby incorporated by reference.

TECHNICAL FIELD

The subject matter herein generally relates to the field of wheeled vehicles, in particular to a wheeled vehicle and a wheel of the same.

BACKGROUND

With the improvement of people's living standards, people's aesthetic needs for products are getting higher and higher. Nowadays, a wheeled vehicle, e.g. a scooter, is a common transportation and entertainment tool in life. Many manufacturers design a wheel of the wheeled vehicle as a light-emitting wheel. The light-emitting wheel, especially at night, is highly ornamental and deeply loved by the public. At present, most light-emitting designs of the wheel are to install LED lights on the wheels, to enable a light-emitting effect. However, the present light-emitting effect is relatively simple, and the light-emitting effect and pleasure to the public need to be improved.

SUMMARY

The present disclosure aims to provide a wheeled vehicle with great pleasure to the public and light-emitting effect and a wheel of the wheeled vehicle for realizing the light-emitting effect.

For solving the problem mentioned above, the present disclosure provides the following technology.

A wheel comprises a wheel body. The wheel body comprises a light-emitting module. The light-emitting module includes a Light Emitting Diode (LED) light bar, a flat mirror, and a two-way mirror. The LED light bar is arranged between the flat mirror and the two-way mirror. Both a mirror surface of the flat mirror and a reflective surface of the two-way mirror face the LED light bar. A transparent surface of the two-way mirror faces the outer side of the wheel.

In some embodiments, the light-emitting module further comprises a bracket; the bracket is inlaid in the wheel body. The LED light bar, the flat mirror, and the two-way mirror are mounted on the bracket.

In some embodiments, the wheel further comprises a conductive module. The conductive module comprises a conductive bouncing-pin and a conductive Printed Circuit Board (PCB) board. The conductive bouncing-pin is arranged on a wheel hub of the wheel body. The conductive bouncing-pin is electrically connected to the conductive PCB board, and the conductive PCB board is electrically connected to the LED light bar.

In some embodiments, the wheel body further comprises a motor, and the conductive module is electrically connected to a power source of the motor.

In some embodiments, the light-emitting module is arranged at one side or two sides of the wheel body.

In some embodiments, a plurality of LED lights is arranged on the LED light bar, the plurality of LED lights is uniformly distributed on the LED light bar.

In some embodiments, the bracket comprises a transparent fender for protecting the light-emitting module, and the transparent fender is located at an outside of the two-way mirror.

In some embodiments, a middle portion of the transparent fender defines a through hole, and a trim cover arranged in the through hole of the transparent fender matches to the transparent fender.

The present disclosure, while described in reference to a scooter, provides for a wheeled vehicle. The scooter comprises a frame, and the wheel mentioned above is arranged on the frame.

In at least one exemplary embodiment, the wheeled vehicle can be a baby swing scooter, a balanced scooter, an electric scooter, or a remote-controlled scooter.

Compared with the prior art, the present disclosure discloses a scooter and a wheel of the scooter. The wheel of the scooter comprises a wheel body, and the wheel body is arranged on the light-emitting module. The light-emitting module comprises a LED light bar, a flat mirror, and a two-way mirror. The LED light bar is arranged between the flat mirror and the two-way mirror. Both the mirror surface of the flat mirror and the reflective surface of the two-way mirror face the LED light bar. The transparent surface of the two-way mirror faces the outer side of the wheel. The present disclosure can enable the real image of the LED light to reflect back between the two mirrors indefinitely by using the optical characteristics of the two-way mirror and the mirror. Looking through the transparent surface of the two-way mirror, one can see a black hole illusion that the LED lights extend indefinitely into the interior of the wheel, which makes the interior of the wheel appear a hollow visual effect to attract people's attention, thereby increasing the attractiveness of the product for consumers and enhancing the market competitiveness of the products.

In addition, the present disclosure uses only one group of LED lights to achieve the visual effect of coexistence of multiple groups of LED lights. It can improve the pleasure to the public and can also relatively reduce the power consumption, and reduce the burden on the battery, which is beneficial to the stable navigation of the scooter.

BRIEF DESCRIPTION OF THE DRAWINGS

Implementations of the present technology will now be described, by way of example only, with reference to the figures.

DETAILED DESCRIPTION

Figure 1:
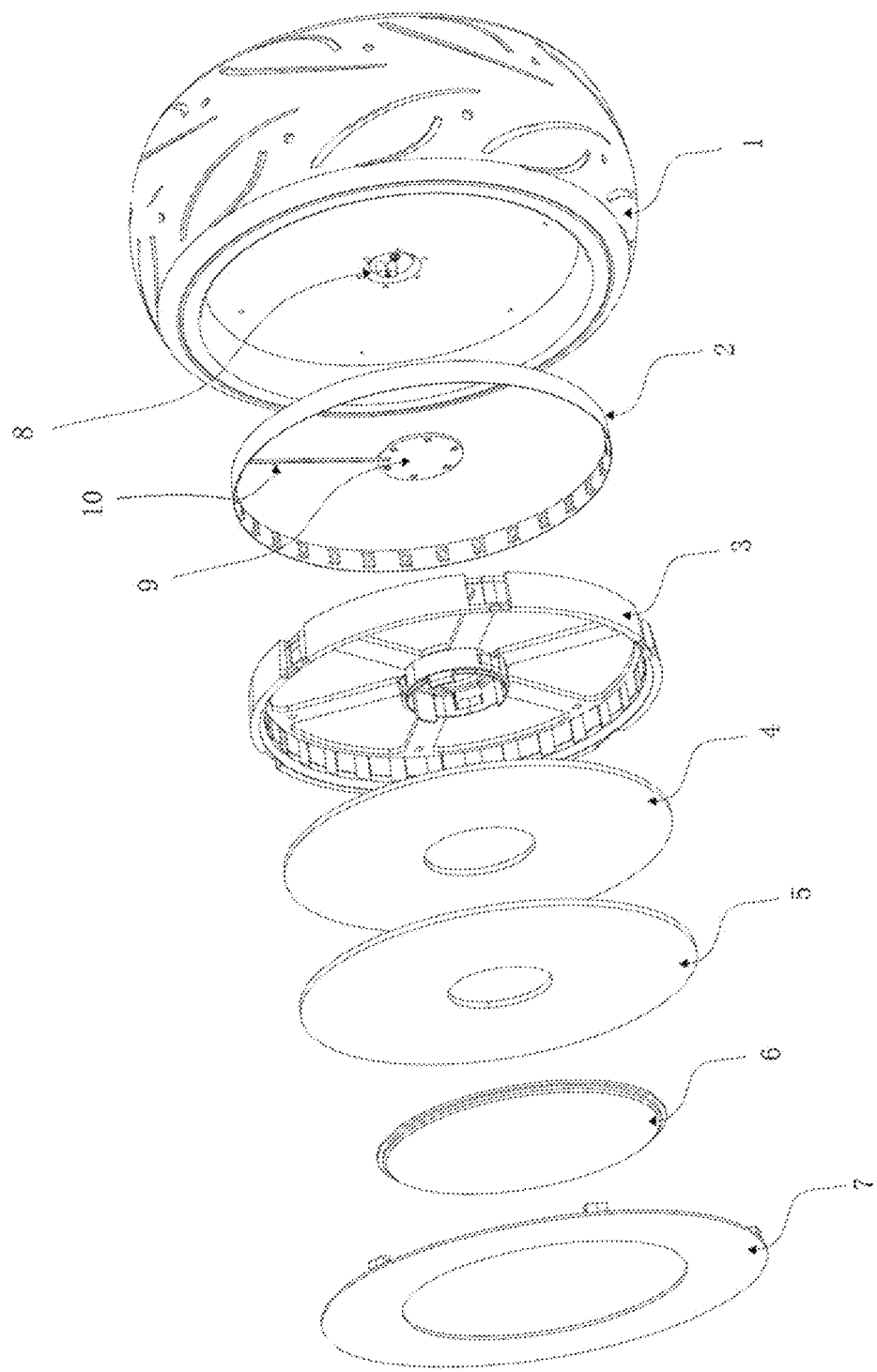
FIG. 1 is an exploded, isometric view of one exemplary embodiment of a wheel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to better illustrate details and features of the present disclosure.

In order to make the purposes, the technical solutions and the advantages of the present disclosure be clearer and more understandable, the present disclosure will be further described in detail below with reference to accompanying figures and embodiments. It should be understood that the specific embodiments described herein are merely intended to illustrate but not to limit the present disclosure.

Several definitions that apply throughout this disclosure will now be presented.

The terms "arranged" and "mounted" when utilized, mean a component is directly located on another component or located at a middle portion of another component. The term "connected" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like. The relative term "left", "right", "above" and "below" in the embodiments of the present disclosure is merely relative concepts or refer to the normal use state of the product, but should not be considered as being restrictive.

While the present disclosure described in relation to a scooter, it is understood that the disclosure applies to all wheeled vehicles.

FIG. 1 illustrates that a wheel of a scooter comprises a wheel body 1. The wheel body 1 comprises a light-emitting module (not labeled). The light-emitting module is arranged on the wheel body 1. The light-emitting module comprises a light-emitting diode (LED) light bar 2, a flat mirror 4, and a two-way mirror 5.

In some embodiments, the light-emitting module further comprises a bracket 3. The bracket 3 is wheel-shaped and is inlaid in the wheel body 1. The LED light bar 2, the flat mirror 4, and the two-way mirror 5 are mounted on the bracket 3. The light-emitting module can be steadily mounted to the wheel body 1 through a specific bracket 3.

Figure 2:
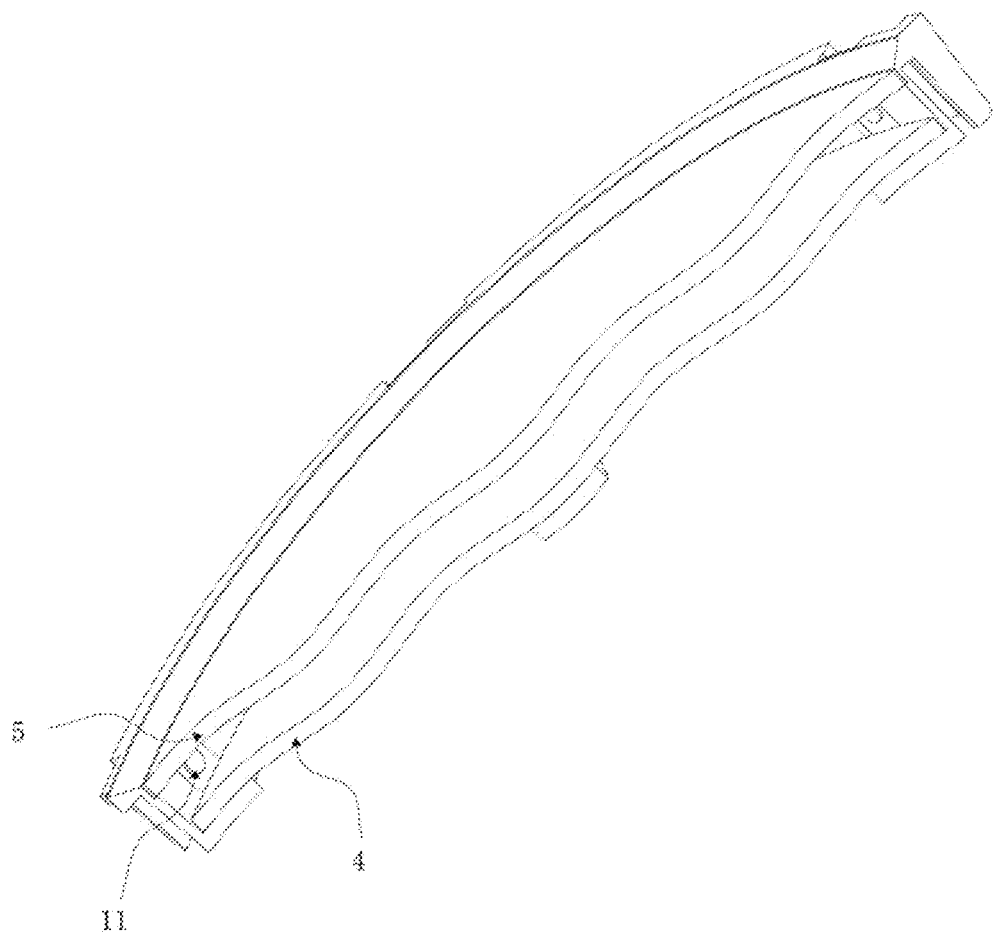
FIG. 2 is a section diagram of a light-emitting module of the wheel of FIG. 1.
Figure 3:
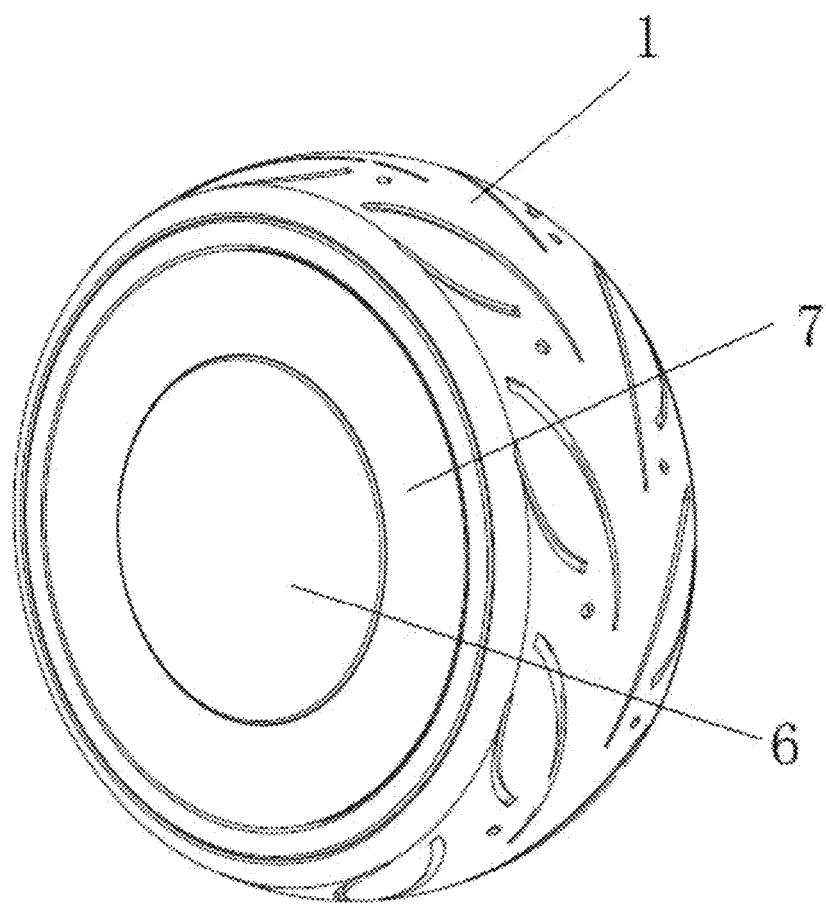
FIG. 3 is a whole outline diagram of the wheel.
Figure 4:
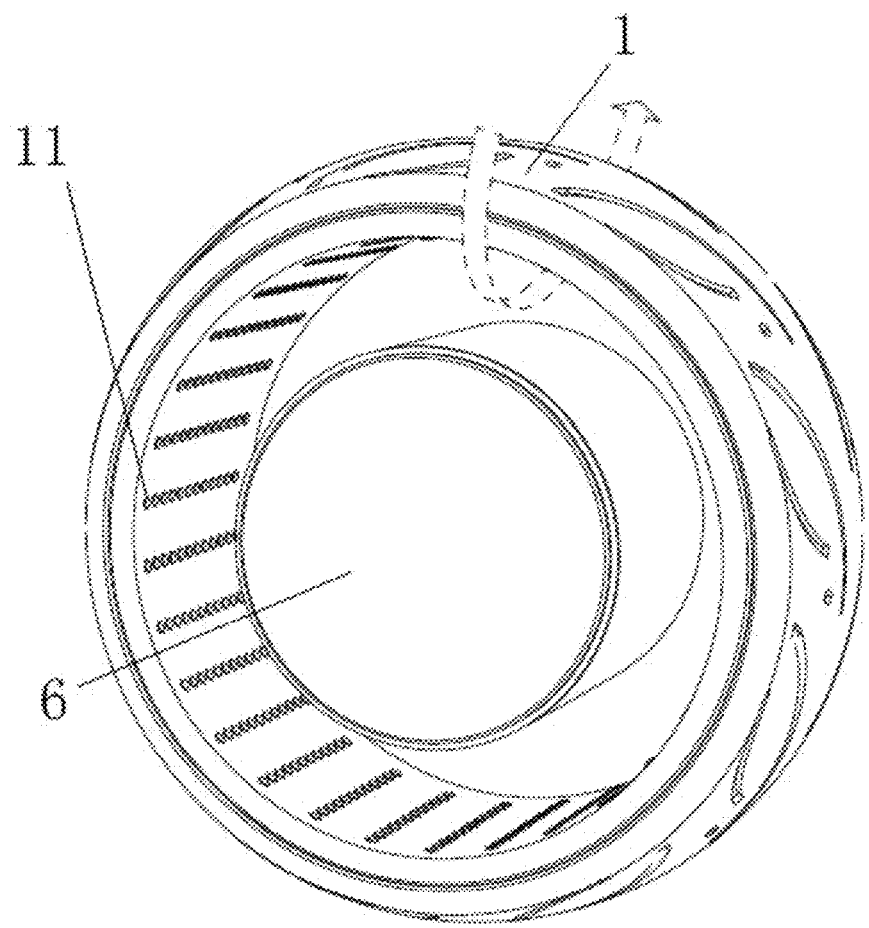
FIG. 4 is a light emitting diagram of the wheel of FIG. 1.

FIGS. 2-4 illustrate that the LED light bar 2 is arranged between the flat mirror 4 and the two-way mirror 5. Both a mirror surface of the flat mirror 4 and a reflective surface of the two-way mirror 5 face the LED light bar 2.

In some embodiments, a plurality of LED lights 11 is arranged on the LED light bar 2. The plurality of LED lights 11 is uniformly distributed on the LED light bar 2. The LED lights 11 are arranged in a row. The LED light bar 2 forms an annulus, and is inserted into an inner side of a wheel of the bracket 3, such an arrangement, instead of the conventional LED lights 11 being installed on the wheel spokes or inlaid in the tire, can ensure that the LED lights 11 to generate the above-mentioned light-emitting effect in a limited wheel space.

When the LED lights 11 are energized and emit light, the mirror image (that is the real image of the LED lights) will reflect between the mirror surface of the flat mirror 4 and the reflective surface of the two-way mirror 5 indefinitely, thus, there is a spatially extended visual effect. A transparent surface of the two-way mirror 5 faces the outer side of the wheel. The light-emitting effect on the wheels will be reflected in the external world. In people's view, when the wheel is stationary, there are groups of LED lights 11 on the wheel extending indefinitely into the wheel around and around, thereby the interior of the wheel presents a hollow visual effect. Moreover, when the wheel is running, a cycle of the aperture on the wheel extends indefinitely into the wheel, giving people an aesthetic visual experience, increasing people's desire to purchase the product, and enhancing the user's experience with the product (especially the visual and psychological enjoyment). It can improve product market competitiveness.

In at least one exemplary embodiment, the light-emitting module can be arranged at one side or two sides of the wheel body 1, to enable the one side or two sides of the wheel body 1 to provide a hollow effect.

In one exemplary embodiment, both the flat mirror 4 and the two-way mirror are ring-shaped structure, and are matched with the bracket 3, such a structure can save material, reduce costs, can also reduce the stress concentration caused by the vibration of the scooter during when the scooter is running, thus ensuring the reliability of the lens.

Specifically, the flat mirror 4, the LED light bar 2 and the two-way mirror 5 are inlaid in the bracket 3 in turn, to ensure that the flat mirror 4 and the two-way mirror 5 to not loosen when the scooter is running, which is favorable for protecting the lens from damage.

The wheel of the exemplary embodiment further comprises a conductive module (not labeled). The conductive module comprises a conductive bouncing-pin 8 and a conductive PCB board 9. The conductive bouncing-pin 8 is arranged at a wheel hub of the wheel body 1. The conductive bouncing-pin 8 is electrically connected to the conductive PCB board 9. The conductive PCB board 9 is electrically connected to the LED light bar 2.

In some embodiments, the wheel body 1 further comprises a motor (not labeled). The conductive module is electrically connected to a power source of the motor. In the exemplary embodiment, the conductive bouncing-pin 8 arranged at the wheel hub of the wheel body 1 shares a power source with the motor on the other side of the wheel hub. The conductive PCB board 9 is mounted on the bracket 3 and is mounted on the wheel body 1 together with the bracket 3. The conductive PCB board 9 is placed on the LED light bar 2 of the bracket 3 and is electrically connected to the bracket 3 through a shred 10. In this way, the space occupied by the conductive module in the wheel body 1 can be reduced, and the LED light bar can be powered directly from the motor and turned on or off together with the motor. The user only needs one action to complete all the functions and facilitate the user's operation. Moreover, a power supply module of the light-emitting module is also saved, and the production cost is reduced. In the exemplary embodiment, the shred 10 can be a wire, a flexible flat cable, or a flexible printed circuit (FPC).

In some embodiments, the bracket 3 of the exemplary embodiment further comprises a transparent fender 7 for protecting the light-emitting module. The transparent fender 7 is arranged at the bracket 3. The transparent fender 7 is located at an outside of the two-way mirror. The transparent fender 7 is located at an outer side of the two-way mirror 5. In the exemplary embodiment, the transparent fender 7 is engaged with the bracket 3, and the surface of the transparent fender 7 is aligned to an outer edge of the wheel body 1, to protect the light-emitting module without external interference. It will not affect the appearance and visibility of the light-emitting effect.

In some embodiments, a middle portion of the transparent fender 7 of the exemplary embodiment further defines a through hole (not labeled), a trim cover 6 arranged in the through hole of the transparent fender 7 matches to the transparent fender 7. The trim cover 6 is mounted on the transparent fender 7 through latching as to block the structure of the inner side and is beneficial to maintaining the whole appearance of the scooter.

Based on the wheel described above, the present disclosure further discloses a scooter. The scooter comprises a frame. The wheel described above is arranged on the frame. This scooter, due to the special light-effect wheel, makes the scooter highly pleasing to the public and helps improve the market competitiveness of the product. In at least one exemplary embodiment, the wheeled vehicle can be a baby swing scooter, a balanced scooter, an electric scooter, or a remote-controlled scooter. Since other components of the wheeled vehicle are prior art, they will not be repeated here.

Compared with the prior art, the present disclosure provides a scooter with great pleasure to the public and light-effect effect and a wheel of the scooter realizing the light-emitting effect. When the scooter starts, the LED on the wheel is energized and emits light, the mirror image will reflect back and forth between the mirror surface of the flat mirror 4 and the reflective surface of the two-way mirror 5 indefinitely, and this creates a spatially extended visual effect. The transparent surface of the two-way mirror faces the outer side of the wheel, and the light-emitting effect on the wheels will be reflected in the outside world. In people's view, when the wheel is stationary, there are groups of LED lights on the wheel extending indefinitely into the wheel around and around, thereby the interior of the wheel presents a hollow visual effect. And when the wheel is running, a cycle of aperture on the wheel extends indefinitely into the wheel, giving people an aesthetic visual experience, increasing people's desire to purchase the product, and enhancing the user's experience with the product (especially the visual enjoyment). It can improve product market competitiveness.

In addition, both the flat mirror and the two-way mirror are ring-shaped structure and match to the bracket; such a structure can save material, reduce costs, can also reduce the stress concentration caused by the vibration of the scooter when the scooter is running, thus ensuring the reliability of the lens. Furthermore, the wheel-shaped bracket is used to ensure that the flat mirror and the two-way mirror to not loosen when the scooter is running, which is favorable for protecting the lens from damage. The matching arrangement of the transparent fender and the trim cover is used to protect the light-emitting module without external interference and it will not affect the visibility of the light-emitting, and is further beneficial to maintaining the whole appearance of the scooter, provides guarantee of stability and reliability of the light-emitting effect for the scooter and the wheel.

The exemplary embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the exemplary embodiments described above may be modified within the scope of the claims.

What is claimed is:

1. A wheel comprising:
a wheel body comprising a light-emitting module;
the light-emitting module comprises a Light Emitting Diode (LED) light bar, a flat mirror, and a two-way mirror; wherein the LED light bar is arranged between the flat mirror and the two-way mirror; both a mirror surface of the flat mirror and a reflective surface of the two-way mirror face the LED light bar; and a transparent surface of the two-way mirror faces an outer side of the wheel.

2. The wheel of claim 1, wherein the light-emitting module further comprises a bracket; the bracket is inlaid in the wheel body; and the LED light bar, the flat mirror, and the two-way mirror are mounted on the bracket.

3. The wheel of claim 2, wherein a transparent fender is arranged at the bracket; and the transparent fender is located at an outside of the two-way mirror.

4. The wheel of claim 3, wherein a middle portion of the transparent fender defines a through hole, and a trim cover is arranged in the through hole of the transparent fender.

5. The wheel of claim 1, further comprises a conductive module, wherein the conductive module comprises a conductive bouncing-pin and a conductive Printed Circuit Board (PCB) board, the conductive bouncing-pin is arranged on a wheel hub of the wheel body, the conductive bouncing-pin is electrically connected to the conductive PCB board, and the conductive PCB board is electrically connected to the LED light bar.

6. The wheel of claim 5, wherein the wheel body further comprises a motor; and the conductive module is electrically connected to a power source of the motor.

7. The wheel of claim 1, wherein the light-emitting module is arranged at one side or two sides of the wheel body.

8. The wheel of claim 1, wherein a plurality of LED lights is arranged on the LED light bar, the plurality of LED lights is uniformly distributed on the LED light bar, and the LED light bar is in the shape of an annulus.

9. A wheeled vehicle, comprising a frame, wherein the wheel of claim 1 is arranged on the frame.

10. The wheeled vehicle of claim 9, wherein the wheeled vehicle is a scooter, a baby swing scooter, a balanced scooter, an electric scooter, or a remote-controlled scooter.

11. The wheeled vehicle of claim 9, wherein the light-emitting module further comprises a bracket; and the bracket is inlaid in the wheel body; the LED light bar, the flat mirror, and the two-way mirror are mounted on the bracket.

12. The wheeled vehicle of claim 11, wherein a transparent fender is arranged at the bracket, and the transparent fender is located at an outside of the two-way mirror.

13. The wheeled vehicle of claim 12, wherein the wheeled vehicle is a scooter, a baby swing scooter, a balanced scooter, an electric scooter, or a remote-controlled scooter.

14. The wheeled vehicle of claim 12, wherein a middle portion of the transparent fender defines a through hole, and a trim cover is arranged in the through hole of the transparent fender.

15. The wheeled vehicle of claim 14, wherein the wheeled vehicle is a scooter, a baby swing scooter, a balanced scooter, an electric scooter, or a remote-controlled scooter.

16. The wheeled vehicle of claim 9, further comprises a conductive module, wherein the conductive module comprises a conductive bouncing-pin and a conductive PCB board, the conductive bouncing-pin is arranged on a wheel hub of the wheel body, the conductive bouncing-pin is electrically connected to the conductive PCB board, and the conductive PCB board is electrically connected to the LED light bar.

17. The wheeled vehicle of claim 16, wherein the wheel body further comprises a motor; and the conductive module is electrically connected to a power source of the motor.

18. The wheeled vehicle of claim 9, wherein the light-emitting module is arranged at one side or two sides of the wheel body.

19. The wheeled vehicle of claim 9, wherein a plurality of LED lights is arranged on the LED light bar, the plurality of LED lights is uniformly distributed on the LED light bar, and the LED light bar is in the shape of an annulus.

20. The wheeled vehicle of claim 19, wherein the wheeled vehicle is a scooter, a baby swing scooter, a balance scooter, an electric scooter, or a remote-controlled scooter.

* * * * *